United States Patent
Khlat

(10) Patent No.: US 10,819,285 B1
(45) Date of Patent: Oct. 27, 2020

(54) ENVELOPE TRACKING POWER AMPLIFIER CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/715,214

(22) Filed: Dec. 16, 2019

Related U.S. Application Data

(60) Provisional application No. 62/857,521, filed on Jun. 5, 2019.

(51) Int. Cl.
| | |
|---|---|
| *H03F 1/02* | (2006.01) |
| *H03F 3/19* | (2006.01) |
| *H03F 3/24* | (2006.01) |
| *H04B 1/40* | (2015.01) |
| *H04B 1/04* | (2006.01) |

(52) U.S. Cl.
CPC ............... *H03F 1/02* (2013.01); *H03F 3/19* (2013.01); *H03F 3/245* (2013.01); *H04B 1/0475* (2013.01); *H04B 1/40* (2013.01); *H03F 2200/102* (2013.01); *H03F 2200/331* (2013.01); *H03F 2200/451* (2013.01); *H03F 2203/21106* (2013.01); *H04B 2001/0408* (2013.01)

(58) Field of Classification Search
CPC ........................................................ H03F 1/02
See application file for complete search history.

(56) References Cited

U.S. PATENT DOCUMENTS

| | | | | |
|---|---|---|---|---|
| 2006/0094352 A1* | 5/2006 | Karabinis | .......... | H04B 7/18563 455/13.4 |
| 2011/0182339 A1* | 7/2011 | Kang | .................. | H04L 27/2624 375/224 |
| 2014/0038675 A1* | 2/2014 | Khlat | ..................... | H04L 5/001 455/574 |

* cited by examiner

*Primary Examiner* — Hsinchun Liao
(74) *Attorney, Agent, or Firm* — Withrow & Terranova, P.L.L.C.

(57) ABSTRACT

An envelope tracking (ET) power amplifier circuit and related apparatus are provided. The ET power amplifier circuit includes at least two power amplifiers configured to amplify at least two radio frequency (RF) signals having different amplitudes. The ET power amplifiers may be configured to amplify a summed RF signal corresponding to a summation of the RF signals and a differential RF signal corresponding to a differential of the RF signals. Given that the summed RF signal and the differential RF signal can have identical amplitude, it is possible for the ET power amplifiers to concurrently amplify the summed RF signal and the differential RF signal based on a common ET voltage. As such, an ET amplifier apparatus employing the ET power amplifier circuit can be configured to generate a lesser number of ET voltages, thus helping to reduce complexity, cost, and footprint of the ET amplifier apparatus.

20 Claims, 4 Drawing Sheets

ENVELOPE TRACKING POWER AMPLIFIER CIRCUIT AND RELATED APPARATUS

RELATED APPLICATIONS

This application claims the benefit of provisional patent application Ser. No. 62/857,521, filed Jun. 5, 2019, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation new radio (5G-NR) wireless communication technology has been widely regarded as the next wireless communication standard beyond the current third-generation (3G) communication standard, such as wideband code division multiple access (WCDMA), and the fourth-generation (4G) communication standard, such as Long-Term Evolution (LTE). As such, a 5G-NR capable mobile communication device is expected to achieve significantly higher data rates, improved coverage range, enhanced signaling efficiency, and reduced latency compared with a conventional mobile communication device supporting only the 3G and 4G communication standards.

The 5G-NR capable mobile communication device can be configured to transmit a radio frequency (RF) signal(s) in a millimeter wave (mmWave) RF spectrum(s), such as an RF spectrum above 28 GHz. RF signals transmitted in the mmWave RF spectrum are susceptible to propagation attenuation and interference. In this regard, the 5G-NR capable mobile communication device typically employs a power amplifier circuit(s) to help improve signal-to-noise ratio (SNR) and/or signal-to-interference-plus-noise ratio (SINR) of the RF signal(s). To mitigate the propagation attenuation, the 5G-NR capable mobile communication device may be configured to explore multipath diversity by simultaneously transmitting the RF signal(s) via multiple antennas. Furthermore, by simultaneously transmitting the RF signal(s) via multiple antennas, the 5G-NR capable mobile communication device may be able to increase data rates through spatial multiplexing.

Envelope tracking (ET) is a power management technique designed to improve operating efficiency of the power amplifier(s) to help reduce power consumption and thermal dissipation. More specifically, the power amplifier(s) is configured to amplify the RF signal(s) based on an ET voltage that rises and falls in accordance to an amplitude of the RF signal(s). Understandably, the better the ET voltage tracks the amplitude of the RF signal(s), the higher efficiency can be achieved in the power amplifier(s). In this regard, it may be desirable to provide the ET voltage in accordance to the amplitude of the RF signal(s), particularly when the 5G-NR capable mobile communication device is configured to support multipath diversity and/or spatial multiplexing.

SUMMARY

Embodiments of the disclosure relate to an envelope tracking (ET) power amplifier circuit and related apparatus. In a non-limiting example, the ET power amplifier circuit is configured to support such multi-antenna schemes as multiple-input multiple-output (MIMO) diversity and/or MIMO spatial multiplexing. In this regard, the ET power amplifier circuit includes at least two power amplifiers configured to amplify at least two radio frequency (RF) signals having different amplitudes. As opposed to amplifying the RF signals directly, the ET power amplifiers may be configured to amplify a summed RF signal corresponding to a summation of the RF signals and a differential RF signal corresponding to a differential of the RF signals. Given that the summed RF signal and the differential RF signal can be configured with identical amplitude, it is thus possible for the ET power amplifiers to concurrently amplify the summed RF signal and the differential RF signal based on a common ET voltage. As such, an ET amplifier apparatus employing the ET power amplifier circuit can be configured to generate a lesser number of ET voltages, thus helping to reduce complexity, cost, and footprint of the ET amplifier apparatus.

In one aspect, an ET power amplifier circuit is provided. The ET power amplifier circuit includes a first signal output that provides a first RF signal to a first antenna coupled to the first signal output. The ET power amplifier circuit also includes a second signal output that provides a second RF signal to a second antenna coupled to the second signal output. The ET power amplifier circuit also includes a first power amplifier configured to amplify a summed RF signal corresponding to a summation of the first RF signal and the second RF signal based on an ET voltage. The ET power amplifier circuit also includes a second power amplifier configured to amplify a differential RF signal corresponding to a differential between the first RF signal and the second RF signal based on the ET voltage. The ET power amplifier circuit also includes an output circuit. The output circuit is configured to receive the summed RF signal and the differential RF signal from the first power amplifier and the second power amplifier, respectively. The output circuit is also configured to regenerate the first RF signal and the second RF signal from the summed RF signal and the differential RF signal. The output circuit is also configured to provide the first RF signal and the second RF signal to the first signal output and the second signal output, respectively.

In another aspect, an ET amplifier apparatus is provided. The ET amplifier apparatus includes an ET integrated circuit (ETIC) configured to generate an ET voltage. The ET amplifier apparatus also includes an ET power amplifier circuit. The ET power amplifier circuit includes a first signal output that provides a first RF signal to a first antenna coupled to the first signal output. The ET power amplifier circuit also includes a second signal output that provides a second RF signal to a second antenna coupled to the second signal output. The ET power amplifier circuit also includes a first power amplifier configured to amplify a summed RF signal corresponding to a summation of the first RF signal and the second RF signal based on the ET voltage. The ET power amplifier circuit also includes a second power amplifier configured to amplify a differential RF signal corresponding to a differential between the first RF signal and the second RF signal based on the ET voltage. The ET power amplifier circuit also includes an output circuit. The output circuit is configured to receive the summed RF signal and the differential RF signal from the first power amplifier and the second power amplifier, respectively. The output circuit is also configured to regenerate the first RF signal and the second RF signal from the summed RF signal and the differential RF signal. The output circuit is also configured to provide the first RF signal and the second RF signal to the first signal output and the second signal output, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
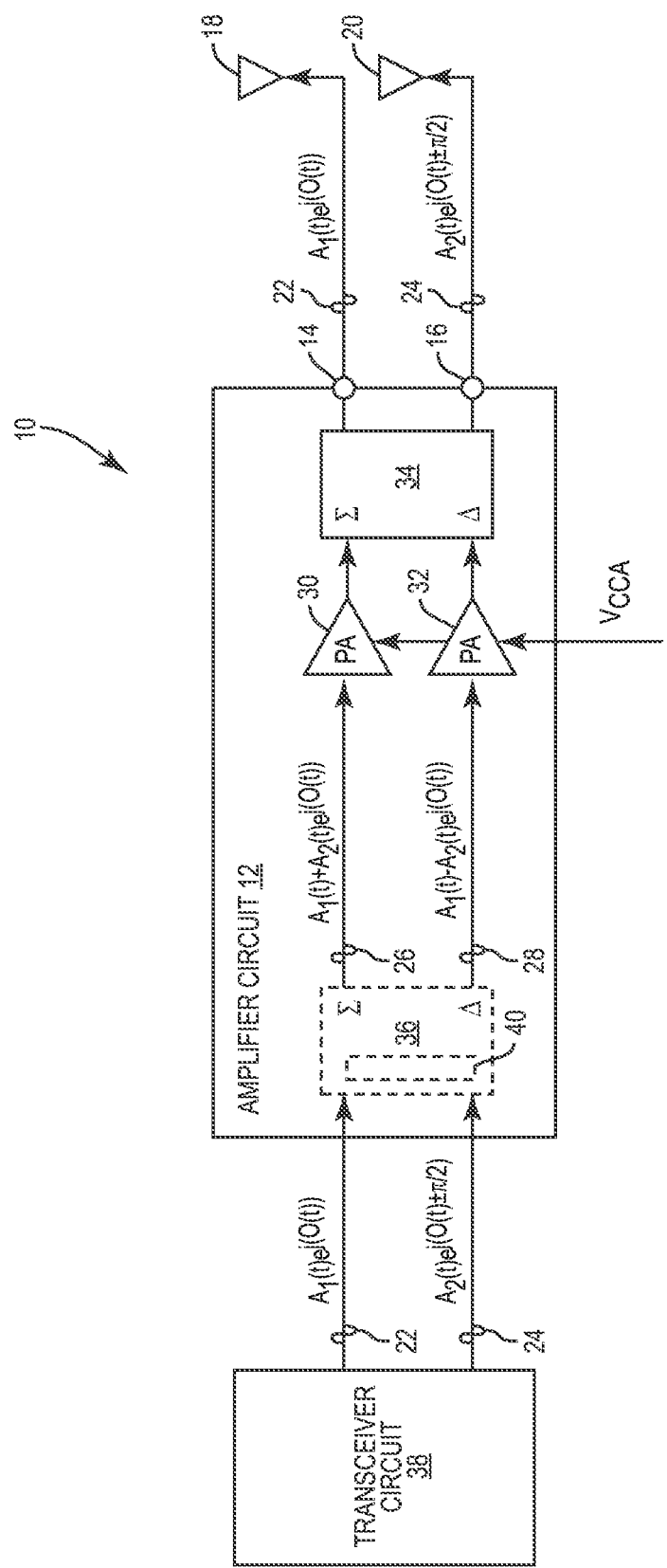
FIG. 1 is a schematic diagram of an exemplary envelope tracking (ET) amplifier apparatus including an ET power amplifier circuit configured according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power amplifier circuit and related apparatus. In a non-limiting example, the ET power amplifier circuit is configured to support such multi-antenna schemes as multiple-input multiple-output (MIMO) diversity and/or MIMO spatial multiplexing. In this regard, the ET power amplifier circuit includes at least two power amplifiers configured to amplify at least two radio frequency (RF) signals having different amplitudes. As opposed to amplifying the RF signals directly, the ET power amplifiers may be configured to amplify a summed RF signal corresponding to a summation of the RF signals and a differential RF signal corresponding to a differential of the RF signals. Given that the summed RF signal and the differential RF signal can be configured with identical amplitude, it is thus possible for the ET power amplifiers to concurrently amplify the summed RF signal and the differential RF signal based on a common ET voltage. As such, an ET amplifier apparatus employing the ET power amplifier circuit can be configured to generate a lesser number of ET voltages, thus helping to reduce complexity, cost, and footprint of the ET amplifier apparatus.

In this regard, FIG. 1 is a schematic diagram of an exemplary ET amplifier apparatus 10 including an ET power amplifier circuit 12 configured according to an embodiment of the present disclosure. In a non-limiting example, the ET power amplifier circuit 12 includes at least one first signal output 14 and at least one second signal output 16. The first signal output 14 and the second signal output 16 may be coupled to at least one first antenna 18 and at least one second antenna 20, respectively. In this regard, the ET power amplifier circuit 12 can be configured to output at least one first RF signal 22 and at least one second RF signal 24 for concurrent radiation via the first antenna 18 and the second antenna 20, respectively. Accordingly, the ET amplifier apparatus 10 can be configured to support MIMO diversity and/or MIMO spatial multiplexing.

Figure 2:
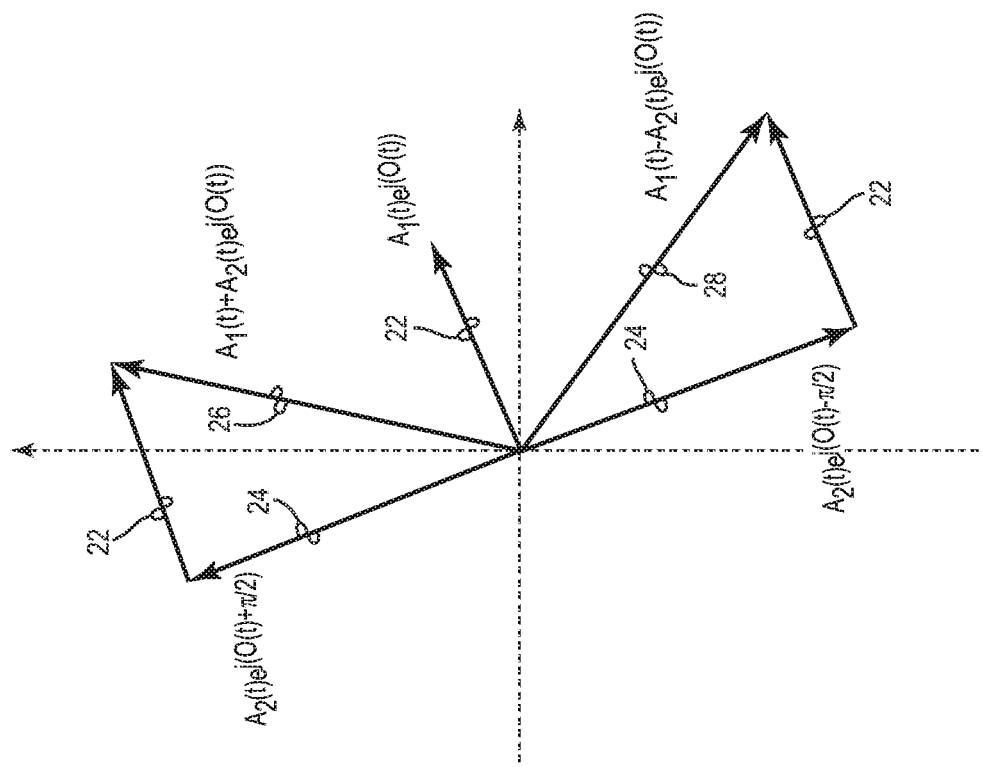
FIG. 2 is a polar coordinate system providing an exemplary illustration of a pair of radio frequency (RF) signals configured to be transmitted concurrently by the ET amplifier apparatus of FIG. 1.

FIG. 2 is an exemplary polar coordinate system providing an exemplary illustration of the first RF signal 22 and the second RF signal 24 configured to be transmitted concurrently by the ET amplifier apparatus 10 of FIG. 1.

As shown in FIG. 2, the first RF signal 22 is represented by a first vector $A_1(t)e^{j(O)(t)}$, in which $A_1(t)$ corresponds to a first amplitude of the first RF signal 22. The second RF signal 24 can be represented by a second vector $A_2(t)e^{j(O(t)+\pi/2)}$ or a third vector $A_2(t)e^{j(O(t)-\pi/2)}$, in which $A_2(t)$ corresponds to a second amplitude of the second RF signal 24. As shown in FIG. 2, the second vector $A_2(t)e^{j(O(t)+\pi/2)}$ has a 180° phase offset from the third vector $A_2(t)e^{j(O(t)+\pi/2)}$ and the first vector $A_1(t)e^{j(O(t))}$ has a plus or minus ninety-degree (±90°) phase offset relative to the second vector $A_2(t)e^{j(O(t)+\pi/2)}$ and the third vector $A_2(t)e^{j(O(t)-\pi/2)}$. In this regard, the first RF signal 22 may be said to be orthogonal to the second RF signal 24.

As shown in FIG. 2, the first amplitude $A_1(t)$ is different from the second amplitude $A_2(t)$. However, given that the first RF signal 22 is orthogonal to the second RF signal 24, a summed RF signal 26, which corresponds to a summation of the first RF signal 22 and the second RF signal 24 and can be expressed as $(A_1(t)+A_2(t))e^{j(O(t))}$, will have a corresponding amplitude that equals $\sqrt{A_1(t)^2+A_2(t)^2}$. Similarly, a differential RF signal 28, which corresponds to a differential between the first RF signal 22 and the second RF signal 24 and can be expressed as $(A_1(t)-A_2(t))e^{j(O(t))}$, will have a corresponding amplitude that equals $\sqrt{A_1(t)^2+A_2(t)^2}$ as well. In this regard, the summed RF signal 26 and the differential RF signal 28 both have the same amplitude $\sqrt{A_1(t)^2+A_2(t)^2}$. As discussed in detail below, such a characteristic can be explored in the ET amplifier apparatus 10 to help reduce the number of ET voltages required for amplifying the first RF signal 22 and the second RF signal 24 concurrently.

With reference back to FIG. 1, the ET power amplifier circuit 12 is configured to include at least one first power amplifier 30 and at least one second power amplifier 32. The first power amplifier 30 and the second power amplifier 32 are configured to receive and amplify the summed RF signal 26 and the differential RF signal 28, respectively. Given that the summed RF signal 26 and the differential RF signal 28 have the identical amplitude $\sqrt{A_1(t)^2+A_2(t)^2}$, both the first power amplifier 30 and the second power amplifier 32 can be configured to operate based on an ET voltage $V_{CCA}$. In contrast, if the first power amplifier 30 and the second power amplifier 32 are configured to amplify the first RF signal 22 having the first amplitude $A_1(t)$ and the second RF signal 24 having the second amplitude $A_2(t)$, the ET power amplifier circuit 12 would need two different ET voltages tracking the first amplitude $A_1(t)$ and the second amplitude $A_2(t)$, respectively. Thus, by amplifying the summed RF signal 26 and the differential RF signal 28, the ET power amplifier circuit 12 can operate based on a lesser number of ET voltages, thus helping to reduce complexity, cost, and footprint of the ET amplifier apparatus 10.

The ET power amplifier circuit 12 is also configured to include an output circuit 34 configured to receive the summed RF signal 26 and the differential RF signal 28 from the first power amplifier 30 and the second power amplifier 32, respectively. Accordingly, the output circuit 34 can regenerate the first RF signal 22 and the second RF signal 24 based on the amplified summed RF signal 26 and the amplified differential RF signal 28. The output circuit 34 can then provide the first RF signal 22 and the second RF signal 24 to the first signal output 14 and the second signal output 16.

The ET power amplifier circuit 12 may be configured to include an input circuit 36. In one non-limiting example, the input circuit 36 is configured to receive the first RF signal 22 and the second RF signal 24 from a transceiver circuit 38. Accordingly, the input circuit 36 is configured to generate the summed RF signal 26 and the differential RF signal 28 from the first RF signal 22 and the second RF signal 24. The input circuit 36 then provides the summed RF signal 26 and the differential RF signal 28 to the first power amplifier 30 and the second power amplifier 32, respectively.

According to the previous discussion of FIG. 2, the summed RF signal 26 and the differential RF signal 28 will have the same amplitude $\sqrt{A_1(t)^2+A_2(t)^2}$ only when the first RF signal 22 and the second RF signal 24 are orthogonal to each other. However, the first RF signal 22 and the second RF signal 24 generated by the transceiver circuit 38 may not have the ±90° phase offset as required. In this regard, the input circuit 36 may be configured to include a phase shifter 40. The phase shifter 40 can be configured to phase shift at least one of the first RF signal 22 and the second RF signal 24 to ensure that the first RF signal 22 is orthogonal to the second RF signal 24.

It should be appreciated that it may be possible to configure the transceiver circuit 38 to provide the summed RF signal 26 and the differential RF signal 28 directly to the first power amplifier 30 and the second power amplifier 32, respectively. In this regard, it may be possible to eliminate the input circuit 36 and the phase shifter 40 from the ET power amplifier circuit 12.

The ET amplifier apparatus 10 can be dynamically configured to enable a variety of concurrent transmission scenarios. In one non-limiting example, the first RF signal 22 and the second RF signal 24 can be modulated by the transceiver circuit 38 to carry identical data payload(s). In this regard, the first RF signal 22 is identical to the second RF signal 24. As such, the first RF signal 22 and the second RF signal 24 that are radiated concurrently from the first antenna 18 and the second antenna 20 can propagate through different paths to reach an intended receiver (not shown), thus allowing the ET amplifier apparatus 10 to operate based on a two-by-two (2×2) MIMO diversity scheme.

In another non-limiting example, the first RF signal 22 and the second RF signal 24 can be modulated by the transceiver circuit 38 to carry different data payload(s). In this regard, the first RF signal 22 is different from the second RF signal 24. As such, the ET amplifier apparatus 10 can be configured to enable 2×2 MIMO spatial multiplexing. It should be appreciated that the ET amplifier apparatus 10 can also be configured to either transmit the first RF signal 22 via the first antenna 18 or transmit the second RF signal 24 via the second antenna 20 without affecting operation principles of the ET power amplifier circuit 12.

Figure 3:
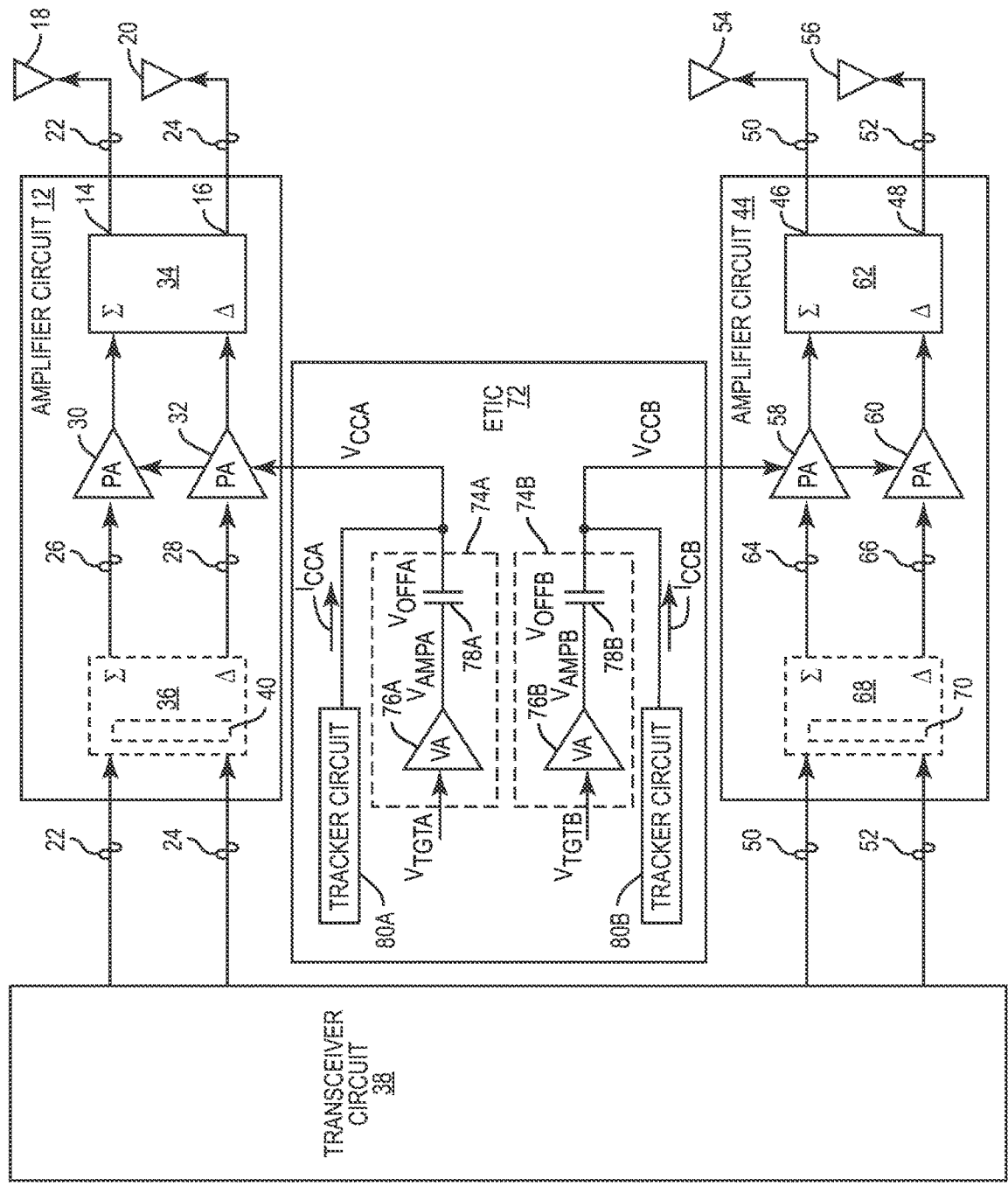
FIG. 3 is a schematic diagram of an exemplary ET amplifier apparatus configured according to another embodiment of the present disclosure.

The ET amplifier apparatus 10 can be adapted to support four-by-four (4×4) MIMO diversity and/or 4×4 MIMO spatial multiplexing. In this regard, FIG. 3 is a schematic diagram of an exemplary ET amplifier apparatus 42 configured according to another embodiment of the present disclosure. Common elements between FIGS. 1 and 3 are shown therein with common element numbers and will not be re-described herein.

The ET amplifier apparatus 42 includes a second ET power amplifier circuit 44 having at least one third signal output 46 and at least one fourth signal output 48. The third signal output 46 and the fourth signal output 48 are configured to provide at least one third RF signal 50 having a third amplitude $A_3(t)$ and at least one fourth RF signal 52 having a fourth amplitude $A_4(t)$ to at least one third antenna 54 and at least one fourth antenna 56, respectively. Notably, the third amplitude $A_3(t)$ may be different from the fourth amplitude $A_4(t)$.

Similar to the ET power amplifier circuit 12, the second ET power amplifier circuit 44 includes at least one third power amplifier 58, at least one fourth power amplifier 60, and a second output circuit 62 that are functionally equivalent to the first power amplifier 30, the second power amplifier 32, and the output circuit 34, respectively. In this regard, the third power amplifier 58 is configured to amplify a second summed RF signal 64 corresponding to a summation of the third RF signal 50. The fourth power amplifier 60 is configured to amplify a second differential RF signal 66 corresponding to a differential between the third RF signal 50 and the fourth RF signal 52. Like the summed RF signal 26 and the differential signal 28, the second summed RF signal 64 will have the identical amplitude $\sqrt{A_3(t)^2+A_4(t)^2}$ as the second differential RF signal 66. As such, both the third power amplifier 58 and the fourth power amplifier 60 can be configured to amplify the second summed RF signal 64 and the second differential RF signal 66 based on a second ET voltage $V_{CCB}$.

The second output circuit 62 receives the amplified second summed RF signal 64 and the amplified second differential RF signal 66 from the third power amplifier 58 and the fourth power amplifier 60, respectively. Accordingly, the second output circuit 62 is configured to regenerate the third RF signal 50 and the fourth RF signal 52 from the second summed RF signal 64 and the second differential RF signal 66. The second output circuit 62 then provides the third RF signal 50 and the fourth RF signal 52 to the third signal output 46 and the fourth signal output 48, respectively.

The second ET power amplifier circuit 44 may include a second input circuit 68 that is functionally equivalent to the input circuit 36. In this regard, the second input circuit 68 may be configured to receive the third RF signal 50 and the fourth RF signal 52 from the transceiver circuit 38. Accordingly, the second input circuit 68 may generate the second summed RF signal 64 and the second differential RF signal 66 based on the third RF signal 50 and the fourth RF signal 52. Notably, the third RF signal 50 and the fourth RF signal 52 may not necessarily be locked at a ±90° phase offset. As such, the second input circuit 68 may include a second phase shifter 70 configured to phase shift at least one of the third RF signal 50 and the fourth RF signal 52 such that the third RF signal 50 can be orthogonal to the fourth RF signal 52.

The ET amplifier apparatus 42 may include an ET integrated circuit (IC) (ETIC) 72 configured to generate the ET voltage $V_{CCA}$ and the second ET voltage $V_{CCB}$, either concurrently or independently. In a non-limiting example, the ETIC 72 includes a first voltage amplifier circuit 74A and a second voltage amplifier circuit 74B configured to generate the ET voltage $V_{CCA}$ and the second ET voltage $V_{CCB}$, respectively. More specifically, the first voltage amplifier circuit 74A includes a first voltage amplifier 76A (denoted as "VA") and a first offset capacitor 78A. The first voltage amplifier 76A is configured to generate an initial ET voltage $V_{AMPA}$ based on a first ET target voltage $V_{TGTA}$. The first offset capacitor 78A is configured to raise the initial ET voltage $V_{AMPA}$ by an offset voltage $V_{OFFA}$ to generate the ET voltage $V_{CCA}$ ($V_{CCA}=V_{AMPA}+V_{OFFA}$). Accordingly, the first voltage amplifier circuit 74A provides the ET voltage $V_{CCA}$ to both the first power amplifier 30 and the second power amplifier 32.

Likewise, the second voltage amplifier circuit 74B includes a second voltage amplifier 76B (denoted as "VA") and a second offset capacitor 78B. The second voltage amplifier 76B is configured to generate a second initial ET voltage $V_{AMPB}$ based on a second ET target voltage $V_{TGTB}$. The second offset capacitor 78B is configured to raise the second initial ET voltage $V_{AMPB}$ by a second offset voltage $V_{OFFB}$ to generate the second ET voltage $V_{CCB}$ ($V_{CCB}=V_{AMPB}+V_{OFFB}$). Accordingly, the second voltage amplifier circuit 74B provides the second ET voltage $V_{CCB}$ to both the third power amplifier 58 and the fourth power amplifier 60.

In addition, the ETIC 72 can include a tracker circuit 80A and a second tracker circuit 80B. The tracker circuit 80A can be configured to generate and provide a low-frequency current $I_{CCA}$ (e.g., a direct current) to both the first power amplifier 30 and the second power amplifier 32. Similarly, the second tracker circuit 80B can be configured to generate and provide a second low-frequency current $I_{CCB}$ (e.g., a direct current) to both the third power amplifier 58 and the fourth power amplifier 60. By employing the ETIC 72 to support both the ET power amplifier circuit 12 and the second ET power amplifier circuit 44, either concurrently or independently, it may be possible to employ a lesser number of ETICs even as more ET power amplifier circuits are added into the ET amplifier apparatus 42, thus helping to reduce complexity, cost, and footprint of the ET amplifier apparatus 42.

Like the ET amplifier apparatus 10 in FIG. 1, the ET amplifier apparatus 42 can be dynamically configured to enable a variety of concurrent transmission scenarios. In one non-limiting example, the first RF signal 22, the second RF signal 24, the third RF signal 50, and the fourth RF signal 52 can be modulated by the transceiver circuit 38 to carry identical data payload(s). In this regard, the first RF signal 22, the second RF signal 24, the third RF signal 50, and the fourth RF signal 52 are identical RF signals. As such, the first RF signal 22, the second RF signal 24, the third RF signal 50, and the fourth RF signal 52 that are radiated concurrently from the first antenna 18, the second antenna 20, the third antenna 54, and the fourth antenna 56 can propagate through different paths to reach an intended receiver (not shown), thus allowing the ET amplifier apparatus 42 to operate based on a 4×4 MIMO diversity scheme.

In another non-limiting example, the first RF signal 22, the second RF signal 24, the third RF signal 50, and the fourth RF signal 52 can be modulated by the transceiver circuit 38 to carry different data payload(s). In this regard, the first RF signal 22, the second RF signal 24, the third RF signal 50, and the fourth RF signal 52 are different RF signals. As such, the ET amplifier apparatus 42 can be configured to enable 4×4 MIMO spatial multiplexing.

Notably, the 4×4 MIMO diversity and the 4×4 MIMO spatial multiplexing schemes as discussed in FIG. 3 are merely non-limiting examples of what the ET amplifier apparatus 42 can support. It should be appreciated that it is possible to incorporate additional antennas, additional ET power amplifier circuits, and/or additional ETICs into the ET amplifier apparatus 42 to enable additional MIMO diversity and/or MIMO spatial multiplexing schemes, such as eight-by-eight (8×8) MIMO diversity/spatial multiplexing, sixteen-by-sixteen (16×16) MIMO diversity/spatial multiplexing, and so on.

Figure 4:
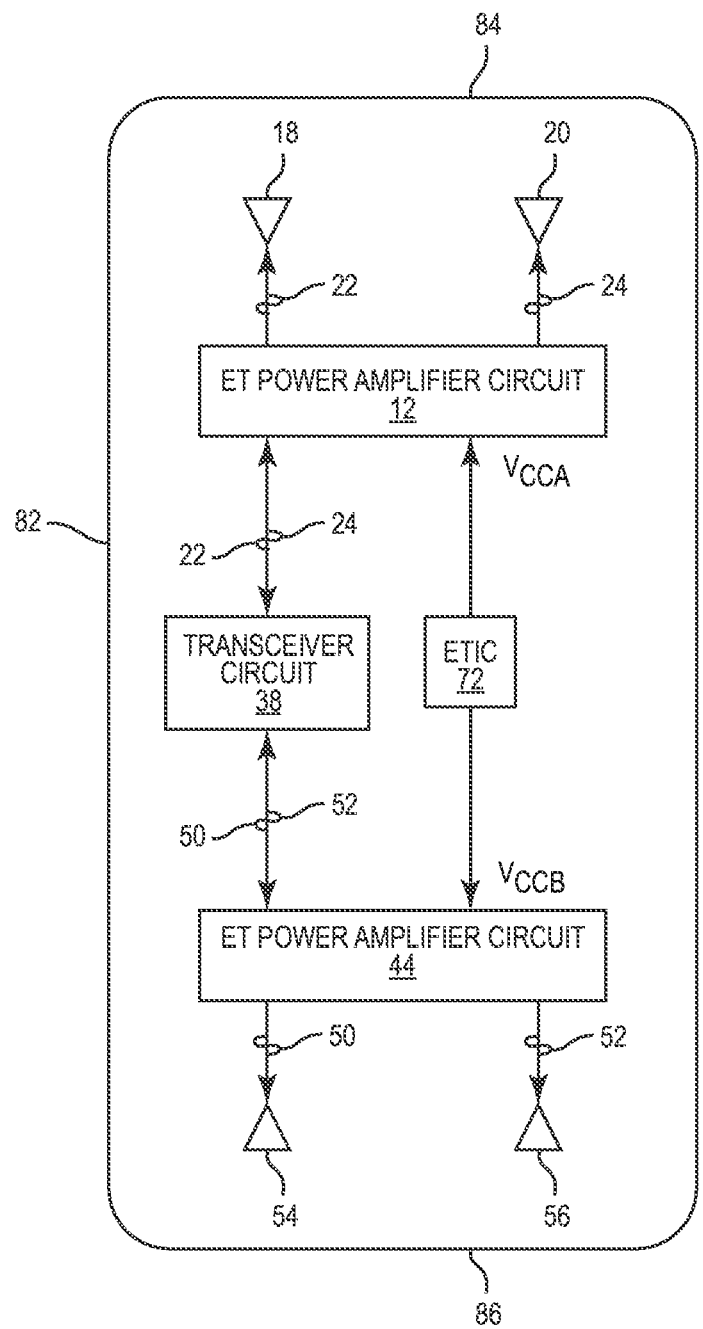
FIG. 4 is a schematic diagram of an exemplary wireless communication apparatus configured to incorporate the ET amplifier apparatus of FIG. 3.

The ET amplifier apparatus 42 can be provided in a wireless communication apparatus (e.g., a smartphone) to enable 4×4 MIMO diversity and/or 4×4 MIMO spatial multiplexing. In this regard, FIG. 4 is a schematic diagram of an exemplary wireless communication apparatus 82 configured to incorporate the ET amplifier apparatus 42 of FIG. 3. Common elements between FIGS. 3 and 4 are shown therein with common element numbers and will not be re-described herein.

In a non-limiting example, the ET power amplifier circuit 12, the first antenna 18, and the second antenna 20 can be provided closer to an upper edge 84 of the wireless communication apparatus 82. In contrast, the second ET power amplifier circuit 44, the third antenna 54, and the fourth antenna 56 can be provided closer to a lower edge 86 of the wireless communication apparatus 82. As such, the wireless communication apparatus 82 may effectively mitigate the so-called "hand-blocking" impact that can compromise RF performance of the wireless communication apparatus 82.

For example, if the third antenna 54 and/or the fourth antenna 56 are blocked by a user's hand(s), the wireless communication apparatus 82 can activate the ET power amplifier circuit 12 to transmit via the first antenna 18 and/or the second antenna 20. In this regard, the wireless communication apparatus 82 may be able to transmit the first RF signal 22 and the second RF signal 24 based on 2×2 MIMO diversity or 2×2 MIMO spatial multiplexing.

In contrast, if the first antenna 18 and/or the second antenna 20 are blocked by the user's hand(s), the wireless communication apparatus 82 can activate the second ET power amplifier circuit 44 to transmit via the third antenna 54 and/or the fourth antenna 56. In this regard, the wireless communication apparatus 82 may be able to transmit the third RF signal 50 and the fourth RF signal 52 based on 2×2 MIMO diversity or 2×2 MIMO spatial multiplexing.

In the event that none of the first antenna 18, the second antenna 20, the third antenna 54, and the fourth antenna 56 is blocked by the user's hand(s), the wireless communication apparatus 82 may activate both the ET power amplifier circuit 12 and the second ET power amplifier circuit 44. Accordingly, the wireless communication apparatus 82 may be able to transmit the first RF signal 22, the second RF signal 24, the third RF signal 50, and the fourth RF signal 52 based on 4×4 MIMO diversity or 4×4 MIMO spatial multiplexing.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) power amplifier circuit comprising:
    a first signal output that provides a first radio frequency (RF) signal to a first antenna coupled to the first signal output;
    a second signal output that provides a second RF signal to a second antenna coupled to the second signal output;
    a first power amplifier configured to amplify a summed RF signal corresponding to a summation of the first RF signal and the second RF signal based on an ET voltage;
    a second power amplifier configured to amplify a differential RF signal corresponding to a differential between the first RF signal and the second RF signal based on the ET voltage; and
    an output circuit configured to:
        receive the summed RF signal and the differential RF signal from the first power amplifier and the second power amplifier, respectively;
        regenerate the first RF signal and the second RF signal from the summed RF signal and the differential RF signal; and
        provide the first RF signal and the second RF signal to the first signal output and the second signal output, respectively.

2. The ET power amplifier circuit of claim 1 further comprising an input circuit configured to:
    receive the first RF signal corresponding to a first amplitude;
    receive the second RF signal corresponding to a second amplitude;
    generate the summed RF signal corresponding to a summation of the first amplitude and the second amplitude; and
    generate the differential RF signal corresponding to a differential between the first amplitude and the second amplitude.

3. The ET power amplifier circuit of claim 2 wherein the first amplitude is configured to be different from the second amplitude.

4. The ET power amplifier circuit of claim 2 wherein the second RF signal is configured to have a ninety-degree phase offset from the first RF signal.

5. The ET power amplifier circuit of claim 4 wherein the input circuit further comprises a phase shifter configured to phase shift at least one of the first RF signal and the second RF signal to cause the ninety-degree phase offset between the first RF signal and the second RF signal.

6. The ET power amplifier circuit of claim 1 wherein the first RF signal and the second RF signal are each configured to carry identical data payload.

7. The ET power amplifier circuit of claim 1 wherein the first RF signal and the second RF signal are each configured to carry different data payloads.

8. An envelope tracking (ET) amplifier apparatus comprising:
    an ET integrated circuit (ETIC) configured to generate an ET voltage; and
    an ET power amplifier circuit comprising:
        a first signal output that provides a first radio frequency (RF) signal to a first antenna coupled to the first signal output;
        a second signal output that provides a second RF signal to a second antenna coupled to the second signal output;
        a first power amplifier configured to amplify a summed RF signal corresponding to a summation of the first RF signal and the second RF signal based on the ET voltage;
        a second power amplifier configured to amplify a differential RF signal corresponding to a differential between the first RF signal and the second RF signal based on the ET voltage; and an output circuit configured to:
- receive the summed RF signal and the differential RF signal from the first power amplifier and the second power amplifier, respectively;
- regenerate the first RF signal and the second RF signal from the summed RF signal and the differential RF signal; and
- provide the first RF signal and the second RF signal to the first signal output and the second signal output, respectively.

9. The ET amplifier apparatus of claim 8 wherein the ET power amplifier circuit further comprising an input circuit configured to:
- receive the first RF signal corresponding to a first amplitude;
- receive the second RF signal corresponding to a second amplitude;
- generate the summed RF signal corresponding to a summation of the first amplitude and the second amplitude; and
- generate the differential RF signal corresponding to a differential between the first amplitude and the second amplitude.

10. The ET amplifier apparatus of claim 9 wherein the first amplitude is configured to be different from the second amplitude.

11. The ET amplifier apparatus of claim 9 wherein the second RF signal is configured to have a ninety-degree phase offset from the first RF signal.

12. The ET amplifier apparatus of claim 11 wherein the input circuit further comprises a phase shifter configured to phase shift at least one of the first RF signal and the second RF signal to cause the ninety-degree phase offset between the first RF signal and the second RF signal.

13. The ET amplifier apparatus of claim 8 further comprising a second ET power amplifier circuit comprising:
- a third signal output that provides a third RF signal to a third antenna coupled to the third signal output;
- a fourth signal output that provides a fourth RF signal to a fourth antenna coupled to the fourth signal output;
- a third power amplifier configured to amplify a second summed RF signal corresponding to a summation of the third RF signal and the fourth RF signal based on a second ET voltage;
- a fourth power amplifier configured to amplify a second differential RF signal corresponding to a differential between the fourth RF signal from the third RF signal based on the second ET voltage; and
- a second output circuit configured to:
  - receive the second summed RF signal and the second differential RF signal from the third power amplifier and the fourth power amplifier, respectively;
  - regenerate the third RF signal and the fourth RF signal from the second summed RF signal and the second differential RF signal; and
  - provide the third RF signal and the fourth RF signal to the third signal output and the fourth signal output, respectively.

14. The ET amplifier apparatus of claim 13 wherein the ETIC is further configured to generate the second ET voltage.

15. The ET amplifier apparatus of claim 14 wherein the ETIC comprises:
- a first voltage amplifier circuit configured to generate the ET voltage based on a first ET target voltage; and
- a second voltage amplifier circuit configured to generate the second ET voltage based on a second ET target voltage.

16. The ET amplifier apparatus of claim 13 wherein the second ET power amplifier circuit further comprising a second input circuit configured to:
- receive the third RF signal corresponding to a third amplitude;
- receive the fourth RF signal corresponding to a fourth amplitude;
- generate the second summed RF signal corresponding to a summation of the third amplitude and the fourth amplitude; and
- generate the second differential RF signal corresponding to a differential between the third amplitude and the fourth amplitude.

17. The ET amplifier apparatus of claim 16 wherein the third amplitude is configured to be different from the fourth amplitude.

18. The ET amplifier apparatus of claim 16 wherein the fourth RF signal is configured to have a ninety-degree phase offset from the third RF signal.

19. The ET amplifier apparatus of claim 13 wherein the first RF signal, the second RF signal, the third RF signal, and the fourth RF signal are each configured to carry identical data payload.

20. The ET amplifier apparatus of claim 13 wherein the first RF signal, the second RF signal, the third RF signal, and the fourth RF signal are each configured to carry different data payloads.

* * * * *

UNITED STATES PATENT AND TRADEMARK OFFICE
CERTIFICATE OF CORRECTION

PATENT NO. : 10,819,285 B1
APPLICATION NO. : 16/715214
DATED : October 27, 2020
INVENTOR(S) : Nadim Khlat Page 1 of 1

It is certified that error appears in the above-identified patent and that said Letters Patent is hereby corrected as shown below:

In the Specification

At Column 5, Line 18, replace "$A_1(t)e^{j(c)(t)}$" with --$A_1(t)e^{j(o(t))}$--.

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*